(12) United States Patent
Kim et al.

(10) Patent No.: US 9,083,002 B2
(45) Date of Patent: Jul. 14, 2015

(54) ORGANIC LIGHT-EMITTING DISPLAY DEVICE

(75) Inventors: Gun-Shik Kim, Yongin (KR); Jun-Sik Oh, Yongin (KR); Jang-Seok Ma, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 561 days.

(21) Appl. No.: 13/283,775

(22) Filed: Oct. 28, 2011

(65) Prior Publication Data
US 2012/0104372 A1    May 3, 2012

(30) Foreign Application Priority Data

Nov. 3, 2010 (KR) .................. 10-2010-0108794

(51) Int. Cl.
*H01L 51/52* (2006.01)
*H01L 27/32* (2006.01)

(52) U.S. Cl.
CPC ........ *H01L 51/5268* (2013.01); *H01L 51/5275* (2013.01); *H01L 27/322* (2013.01); *H01L 27/3211* (2013.01); *H01L 51/5284* (2013.01); *H01L 2251/5369* (2013.01)

(58) Field of Classification Search
CPC ............ H01L 51/5268; H01L 51/5275; H01L 27/322
USPC .......... 257/98, 99, E51.018–E51.022, 40, 59, 257/72; 313/504, 506, 512
See application file for complete search history.

(56) References Cited

U.S. PATENT DOCUMENTS

| | | | |
|---|---|---|---|
| 7,420,322 B2 * | 9/2008 | Takei et al. .................. | 313/500 |
| 2004/0053043 A1 | 3/2004 | Iwata et al. | |
| 2004/0217702 A1 * | 11/2004 | Garner et al. ................ | 313/512 |
| 2006/0250084 A1 | 11/2006 | Cok et al. | |
| 2007/0063641 A1 | 3/2007 | Cok et al. | |
| 2007/0103056 A1 | 5/2007 | Cok | |
| 2007/0200492 A1 * | 8/2007 | Cok et al. ...................... | 313/506 |
| 2007/0200496 A1 | 8/2007 | Cok et al. | |
| 2007/0278951 A1 | 12/2007 | Koo et al. | |

FOREIGN PATENT DOCUMENTS

| | | |
|---|---|---|
| JP | 2003-109747 | 4/2003 |
| KR | 10-2010-0047208 | 5/2010 |
| WO | 98/17083 | 4/1998 |

* cited by examiner

*Primary Examiner* — Matthew W Such
*Assistant Examiner* — Scott Stowe
(74) *Attorney, Agent, or Firm* — Robert E. Bushnell, Esq.

(57) ABSTRACT

An organic light-emitting display device, having a first substrate, a second substrate facing the first substrate, a plurality of pixels disposed between the first and second substrates comprising a first electrode, a second electrode, and an organic light-emitting layer disposed between the first and second electrodes, for suppressing external light reflection and reducing pixel blurring by disposing a scattering structure in a direction a light is extracted at a distance equal to or below an adjacent pixel pitch.

10 Claims, 5 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 3 Nov. 2010, and there duly assigned Serial No. 10-2010-0108794 by that Office.

BACKGROUND OF THE INVENTION

1. Field of the Invention

An embodiments of the present invention relates to an organic light-emitting display device, and more particularly an organic light-emitting display device having suppressed external light reflection and reduced pixel blurring.

2. Description of the Related Art

An organic light-emitting display device is a self-emitting type display device, and not only has a wide viewing angle and excellent contrast, but also a quick response speed.

Contrast and visibility of the organic light-emitting display device may deteriorate due to storing external light, such as sunlight, when an image is viewed outside. Similarly, visibility may also deteriorate due to various external lights including an indoor fluorescent light even when the organic light-emitting display device is used indoor.

A film type polarizing plate was adhered on an entire surface of a conventional organic light-emitting display device so as to prevent deterioration of visibility due to an external light. The film type polarizing plate prevents the external light from being externally reflected after incident on the conventional organic light-emitting display device, thereby decreasing luminance of the reflected external light to prevent deterioration of visibility due to the external light.

However, since the film type polarizing plate adhered on the entire surface of the conventional organic light-emitting display device is manufactured by combining a plurality of layers of films, not only a manufacturing method is complex and a production cost is high, but also a thickness is high, and thus it is difficult to realize a thin organic light-emitting display device.

SUMMARY OF THE INVENTION

An embodiment of the present invention provides an organic light-emitting display device for suppressing external light reflection and reducing pixel blurring by disposing a scattering structure in a direction a light is extracted, at a distance equal to or below an adjacent pixel pitch.

According to an aspect of the present invention, there is provided an organic light-emitting display device including: a first substrate; a second substrate facing the first substrate; a plurality of pixels disposed between the first and second substrates, and including a first electrode, a second electrode, and an organic light-emitting layer disposed between the first and second electrodes; and a scattering structure disposed in a direction a light emitted from the organic light-emitting layer is extracted from the plurality of pixels, and at a distance equal to or below a pixel pitch between adjacent pixels from among the plurality of pixels.

The scattering structure may be a resin layer comprising a plurality of scattering particles.

The scattering structure may be disposed in a light-emitting region corresponding to the plurality of pixels.

The organic light-emitting display device may further include a light absorbing layer disposed in the direction the light is extracted.

The light absorbing layer may be disposed farther than a distance the scattering structure is disposed in the organic light-emitting layer.

The light absorbing layer may be disposed on the same layer as the scattering structure, and comprises the plurality of scattering particles.

The organic light-emitting display device may further include a black matrix disposed in a non light-emitting region excluding the light-emitting region corresponding to the plurality of pixels. The black matrix may be disposed in the non light-emitting region and the light-emitting region alternately with the scattering structure.

The light absorbing layer may be disposed farther than a distance the scattering structure is disposed in the organic light-emitting layer.

The light absorbing layer may be disposed on the same layer as the scattering structure, and comprises the plurality of scattering particles.

An optical resonance distance between the plurality of pixels may be differently designed, and the organic light-emitting display device may further include a color filter disposed in a light-emitting region corresponding to the plurality of pixels.

The plurality of pixels may penetrate a certain color emitted from the organic light-emitting layer according to the designed optical resonance distance, and include a color filter comprising the certain color.

The color filter may be disposed closer than the distance the scattering structure is disposed in the organic light-emitting layer.

The color filter may be disposed on the same layer as the scattering structure, and include the plurality of scattering particles.

The organic light-emitting display device may further include a black matrix disposed in a non light-emitting region excluding a light-emitting region corresponding to the plurality of pixels.

The black matrix may be disposed in the non light-emitting region and the light-emitting region alternately with the scattering structure.

The scattering structure may include a plurality of concave-convex structures.

The organic light-emitting display device may further include a planarization layer having a high refractive index between the organic light-emitting layer and the scattering structure.

The organic light-emitting display device may further include a light absorbing layer disposed in the direction the light is extracted.

The light absorbing layer may be disposed farther than the distance the scattering structure is disposed in the organic light-emitting layer.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, embodiments of the present invention will be described more fully with reference to the accompanying drawings, in which exemplary embodiments of the invention are shown.

Figure 1:
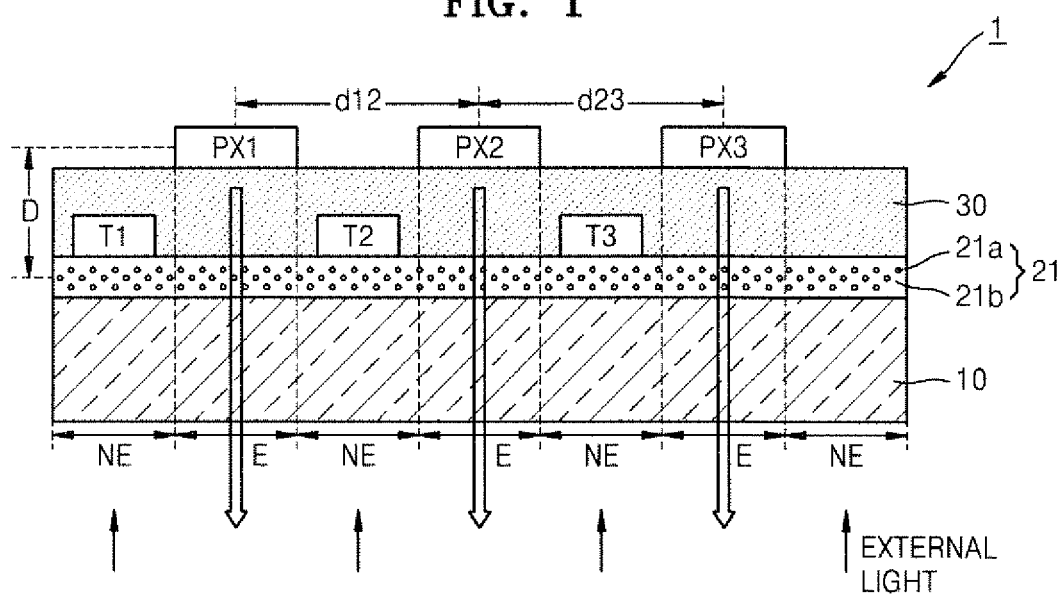
FIG. 1 is a cross-sectional view schematically illustrating an organic light-emitting display device according to an embodiment of the present invention.
Figure 2:
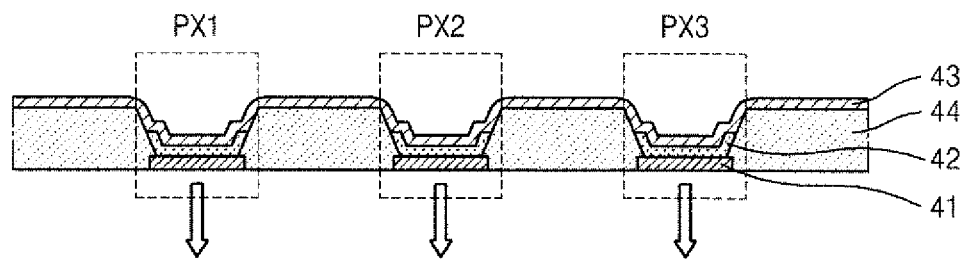
FIG. 2 is a cross-sectional view illustrating a pixel portion of FIG. 1 in detail.

FIG. 1 is a cross-sectional view schematically illustrating an organic light-emitting display device 1 according to an embodiment of the present invention, and FIG. 2 is a cross-sectional view illustrating a pixel portion of FIG. 1 in detail.

Referring to FIG. 1, the organic light-emitting display device 1 according to the current embodiment includes a first substrate 10, a scattering structure 21, a thin film transistor (TFT) layer 30 including a plurality of TFTs T1, T2, and T3, and a plurality of pixels PX1, PX2, and PX3.

The first substrate 10 may be a substrate formed of any one of various materials, such as glass and plastic. Since the organic light-emitting display device 1 according to the current embodiment is a bottom emission type, wherein a light is extracted toward the first substrate 10, and thus the first substrate 10 is formed of a transparent material.

The scattering structure 21 includes a resin layer 21b including a plurality of scattering particles 21a. The scattering particles 21a may include light reflective metal minute particles, such as aluminum, silver, or gold. However, a material of the scattering particles 21a is not limited thereto, and may be anything as long as it has a different refractive index from the resin layer 21b. The resin layer 21b may be formed of any one of various materials, such as styrene-based resin, acryl-based resin, vinyl ester-based resin, vinyl ether-based resin, halogen containing resin, olefin-based resin, polyphenyleneether resin, polyphenylenesulfide-based resin, cellulose derivatives, and silicon resin.

The TFT layer 30 including the plurality of TFTs T1, T2, and T3 is disposed between the scattering structure 21 and the plurality of pixels PX1, PX2, and PX3. Although not illustrated in FIG. 1 in detail, the TFTs T1, T2, and T3 may be respectively electrically connected to the pixels PX1, PX2, and PX3. Also, in FIG. 1, the TFT layer 30 only includes the TFTs T1, T2, and T3, but the TFT layer 30 may include another element. In other words, the TFT layer 30 may further include various wires (not shown), including the TFTs T1, T2, and T3. In addition, although it is not illustrated in detail, the TFT layer 30 may further include a plurality of insulation layers (not shown) for insulating wires from each other.

The plurality of pixels PX1, PX2, and PX3 are disposed on the TFT layer 30. Adjacent pixels of the pixels PX1, PX2, and PX3 are spaced apart from each other by a predetermined pixel pitch. In FIG. 1, a pixel pitch d12 between the pixels PX1 and PX2 and a pixel pitch d23 between the pixels PX2 and PX3 are identical, but alternatively, the pixel pitches d12 and d23 may be different from each other.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

Referring to FIG. 2, the pixels PX1, PX2, and PX3 each include a first electrode 41, a second electrode 43, and an organic light-emitting layer 42 disposed between the first and second electrodes 41 and 43.

When a voltage is applied to the first and second electrodes 41 and 43, electrons and holes respectively injected from the first and second electrodes 41 and 43 combine in the organic light-emitting layer 42 to generate excitons, and the organic light-emitting layer 42 emits light by the excitons.

The organic light-emitting display device 1 according to the current embodiment is a bottom emission type, wherein a light emitted from the organic light-emitting layer 42 is extracted toward the first substrate 10. Accordingly, the first electrode 41 may be a transparent electrode, and the second electrode 43 may be a reflective electrode. The first electrode 41 may be formed of a transparent conductive material, such as indium tin oxide (ITO), indium zinc oxide (IZO), zinc oxide (ZnO), or indium oxide (In2O3), and the second electrode 43 may include a reflective layer formed of at least one material selected from the group consisting of silver (Ag), magnesium (Mg), aluminum (Al), platinum (Pt), palladium (Pd), gold (Au), nickel (Ni), neodymium (Nd), iridium (Ir), and chromium (Cr), and a transparent layer formed of ITO, IZO, ZnO, or In2O3.

The organic light-emitting layer 42 may be formed of a low molecular organic material or a high molecular organic material. When a low molecular organic material is used, a hole injection layer (HIL) (not shown), a hole transport layer (HTL) (not shown), an electron transport layer (ETL) (not shown), and an electron injection layer (EIL) (not shown) may be stacked in a single or complex structure. Also, examples of the low molecular organic material include copper phthalocyanine (CuPc), N,N'-Di(naphthalene-1-yl)-N,N'-diphenyl-benzidine (NPB), and tris-8-hydroxyquinoline aluminum (Alq3). When the high molecular organic material is used, a hole injection layer (HIL) (not shown) may be further included. Here, PEDOT is used as the HIL, and a poly-phenylenevinylene (PPV) or polyfluorene high molecular organic material is used as the organic light-emitting layer 42.

A pixel define layer 44, which covers an edge of the first electrode 41 and defines a pixel as the organic light-emitting layer 42 is formed in an opening inside an edge, may be formed between the pixels PX1, PX2, and PX3.

As described above, in the organic light-emitting display device 1 having the bottom emission type according to the current embodiment, an image is realized on the first substrate 10 as the light emitted from the organic light-emitting layer 42 penetrates through the first electrode 41, the TFT layer 30, the scattering structure 21, and the first substrate 10.

Referring again to FIG. 1, here, an external light, such as a sun light or fluorescent light, is also incident inside the organic light-emitting display device 1 through the first substrate 10. The external light incident inside the organic light-emitting display device 1 may be again transferred to the first substrate 10 by being reflected at the TFTs T1, T2, and T3 or the wires of the TFT layer 30, or at the first or second electrode 41 or 43. The reflected external light may operate as a noise with respect to the light emitted from the organic light-emitting layer 42 and realizing the image, thereby deteriorating visibility of the image.

However, the reflected external light may be reduced since the organic light-emitting display device 1 of the current embodiment includes the scattering structure 21 between the first substrate 10 and the pixels PX1, PX2, and PX3. In other words, the external light incident inside the organic light-emitting display device 1 is scattered by the scattering structure 21, and thus part of the external light is absorbed according to total reflection inside a panel. Accordingly, the scattering structure 21 disposed between the first substrate 10 and the pixels PX1, PX2, and PX3 including the organic light-emitting layer 42 suppresses external light reflection, thereby improving visibility of the organic light-emitting display device 1.

Meanwhile, in the organic light-emitting display device 1 of the current embodiment, the scattering structure 21 is not only disposed between the first substrate 10, from which the light is extracted, and the pixels PX1, PX2, and PX3, but also disposed at a location a distance D, equal to or below the pixel pitches d12 and d23 between adjacent pixels, away from the organic light-emitting layer 42 of the pixels PX1, PX2, and PX3 from which the light is emitted. Accordingly, pixel blurring, wherein the image is blurred if the scattering structure 21 is disposed too far from the organic light-emitting layer 42, may be prevented.

Also in FIG. 1, the scattering structure 21 is disposed on the entire surface of the first substrate 10 regardless of a light-emitting region E and anon light-emitting region NE, but a location of the scattering structure 21 is not limited thereto. In other words, the scattering structure 21 may be disposed only on the light-emitting region E corresponding to locations of the pixels PX1, PX2, and PX3 including the organic light-emitting layer 42.

Figure 3:
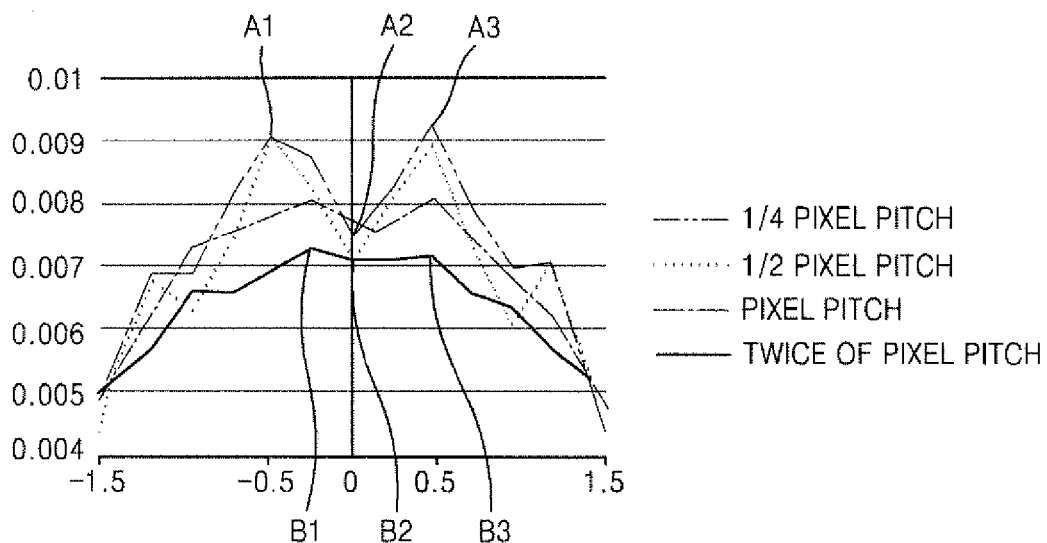
FIG. 3 is a graph of relative intensity of light emitted from two adjacent pixels based on a location in a scattering structure, according to a distance between the two adjacent pixels.

FIG. 3 is a graph of relative intensity of light emitted from two adjacent pixels based on a location in a scattering structure, according to a distance between the two adjacent pixels. A horizontal axis denotes a distance between the two adjacent pixels, and a vertical axis denotes the relative intensity of light.

Referring to FIG. 3, when the scattering structure is disposed at a ¼ distance of a pixel pitch from an organic light-emitting layer, a relative intensity of light emitted from the two adjacent pixels is very large at two points A1 and A3 where the relative intensities are the highest as compared to a pixel boundary point A2 between points A1 and A3. In other words, an observer is able to clearly classify images of the two points A1 and A3, wherein the relative intensities are the highest, based on the pixel boundary point A2.

When the scattering structure is disposed at a ½ distance of the pixel pitch from the organic light-emitting layer, a difference of relative intensity of light between a pixel boundary point and points where the relative intensities are the highest is high like when the scattering structure is disposed at the ¼ distance of the pixel pitch.

Meanwhile, when the scattering structure is disposed at the same distance as the pixel pitch from the organic light-emitting layer, a difference of relative intensity of light between a pixel boundary point and points where the relative intensities are the highest is smaller than the above two cases, but is able to be classified.

However, when the scattering structure is disposed at a distance twice the pixel pitch from the organic light-emitting layer, a difference of relative intensity of light emitted form the two adjacent pixels is very small between a pixel boundary point B2 and two points B1 and B3 where the relative intensities are the highest. In other words, the observer is not able to clearly classify images of the two points B1 and B3, wherein the relative intensities are the highest, based on the pixel boundary point B2.

Accordingly, the organic light-emitting display device 1 according to the current embodiment includes the scattering structure 21 at the location separated from the pixels PX1, PX2, and PX3 including the organic light-emitting layer 42 from which the light is emitted, by the distance D equal to or below the pixel pitches d12 and d23 between the adjacent pixels, thereby improving the visibility of the organic light-emitting display device 1 by decreasing the pixel blurring.

Meanwhile, when the pixel pitches d12 and d23 are different, the scattering structure 21 may be disposed at a distance equal to or below a minimum pixel pitch from among the pixel pitches d12 and d23.

Also, an encapsulation member (not shown) for encapsulating the pixels PX1, PX2, and PX3 so as to protect the pixels PX1, PX2, and PX2 from external moisture and oxygen may be further included.

An organic light-emitting display device 2 according to another embodiment of the present invention will now be described with reference to FIGS. 4 and 5.

Figure 4:
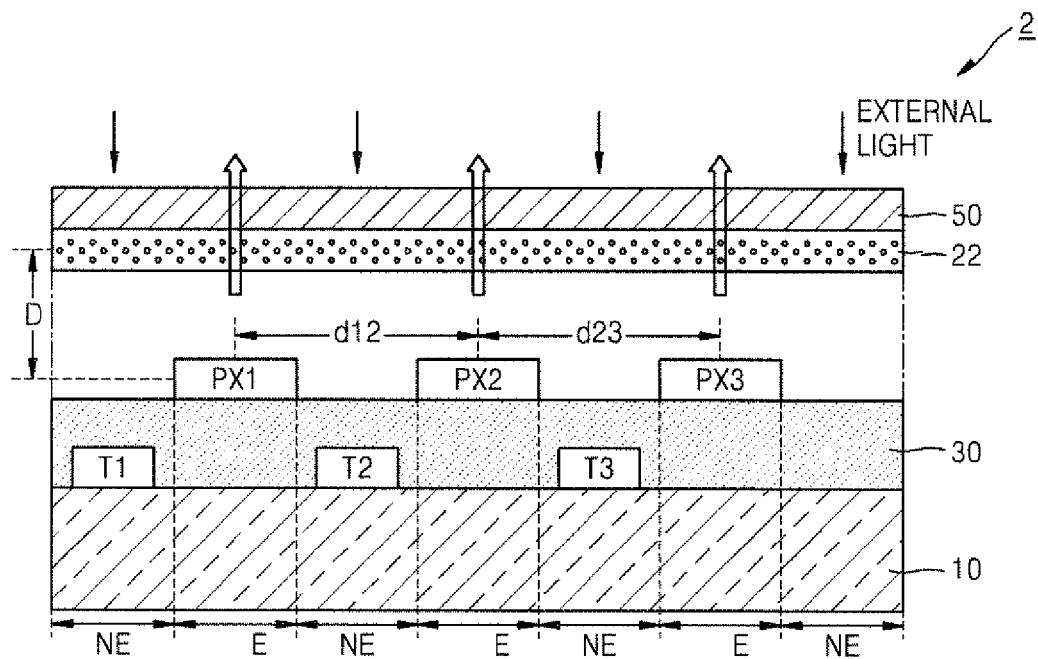
FIG. 4 is a cross-sectional view schematically illustrating an organic light-emitting display device according to another embodiment of the present invention.
Figure 5:
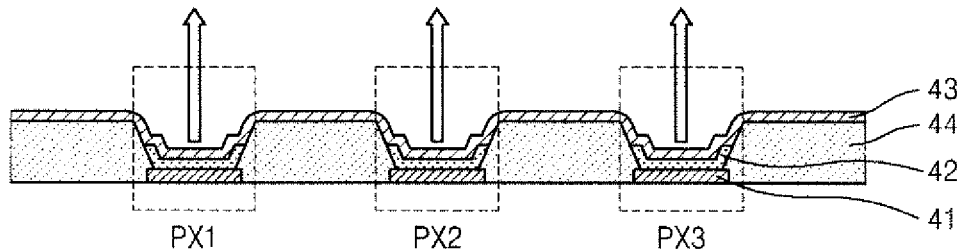
FIG. 5 is a cross-sectional view illustrating a pixel portion of FIG. 4 in detail.

FIG. 4 is a cross-sectional view schematically illustrating the organic light-emitting display device 2 according to the other embodiment of the present invention, and FIG. 5 is a cross-sectional view illustrating a pixel portion of FIG. 4 in detail. A difference between the organic light-emitting display device 1 and the organic light-emitting display device 2 will be mainly described, and like reference numerals denote like elements in drawings.

Referring to FIGS. 4 and 5, the organic light-emitting display device 2 according to the current embodiment includes the first substrate 10, the TFT layer 30 including the TFTs T1, T2, and T3, the pixels PX1, PX2, and PX3, a scattering structure 22, and a second substrate 50.

The second substrate 50 may operate as an encapsulation member for encapsulating the pixels PX1, PX2, and PX3 so as to protect the pixels PX1, PX2, and PX3 from external moisture and oxygen. Accordingly, a sealing member (not shown) for sealing the first substrate 10 and the second substrate 50 may be included.

If the organic light-emitting display device 1 according to the previous embodiment is the bottom emission type, the organic light-emitting display device 2 according to the current embodiment is a top emission type, wherein a light is extracted toward the second substrate 50. Accordingly, the pixels PX1, PX2, and PX3 each include a first electrode 41 constituting a reflective electrode, and a second electrode 43 constituting a transparent electrode. The light emitted from the organic light-emitting layer 42 is reflected at the first electrode 41, and transferred to the second substrate 50, thereby realizing an image. Here, an external light incident inside the organic light-emitting display device 2 is reflected at the TFTs T1, T2, and T3 or various wires of the TFT layer 30, or at the first or second electrodes 41 or 43, and the reflected external light may operate as a noise with respect to the light emitted from the organic light-emitting layer 42 and realizing an image, thereby reducing visibility of the image.

However, since the organic light-emitting display device 2 according to the current embodiment includes the scattering structure 22 disposed between the second substrate 50 and the pixels PX1, PX2, and PX3, visibility of the organic light-emitting display device 2 may be improved by suppressing external light reflection.

Also, in the organic light-emitting display device 2 of the current embodiment, the scattering structure 22 is disposed at a location a distance D, equal to or below the pixel pitches d12 and d23 between adjacent pixels, away from the organic light-emitting layer 42 of the pixels PX1, PX2, and PX3 from which the light is emitted. Accordingly, pixel blurring, wherein the image is blurred, may be prevented.

An organic light-emitting display device 3 according to another embodiment of the present invention will now be described with reference to FIG. 6.

Figure 6:
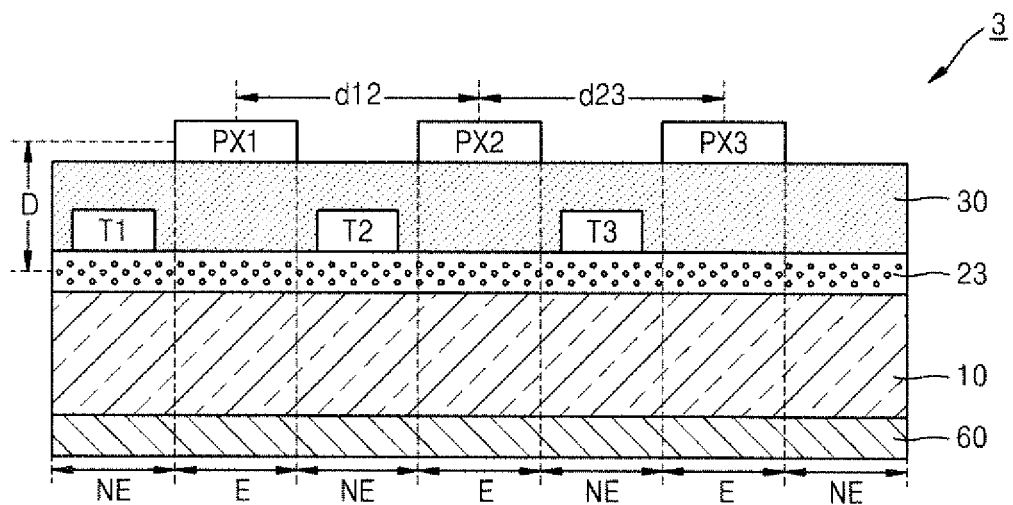
FIGS. 6 through 12 are cross-sectional views schematically illustrating organic light-emitting display devices according to embodiments of the present invention.

Referring to FIG. 6, the organic light-emitting display device 3 according to the current embodiment includes a light absorbing layer 60, the first substrate 10, a scattering structure 23, the TFT layer 30 including the TFTs T1, T2, and T3, and the pixels PX1, PX2, and PX3.

If the organic light-emitting display device 1 is the bottom emission type, the organic light-emitting display device 3 according to the current embodiment is also a bottom emission type, wherein a light is extracted toward the first substrate 10. Organic light-emitting display devices 4 through 9 according to other embodiments of the present invention, which will be described later, are all bottom emission types. However, the organic light-emitting display devices 4 through 9 may alternatively be a top emission type.

The light absorbing layer 60 is disposed in a direction the light is extracted. The light absorbing layer 60 may be a neutral density (ND) film. In the current embodiment, the light absorbing layer 60 is disposed on one side of the first substrate 10. Part of an external light is absorbed by the light absorbing layer 60, and another part of the external light that penetrated the light absorbing layer 60 is absorbed by the scattering structure 23, and thus external light reflection is suppressed.

Also, in the organic light-emitting display device 3 of the current embodiment, the scattering structure 23 is disposed at a location a distance D, equal to or below the pixel pitches d12 and d23 between adjacent pixels, away from the organic light-emitting layer 42 of the pixels PX1, PX2, and PX3 from which the light is emitted. Accordingly, pixel blurring, wherein the image is blurred, may be prevented.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

Figure 7:
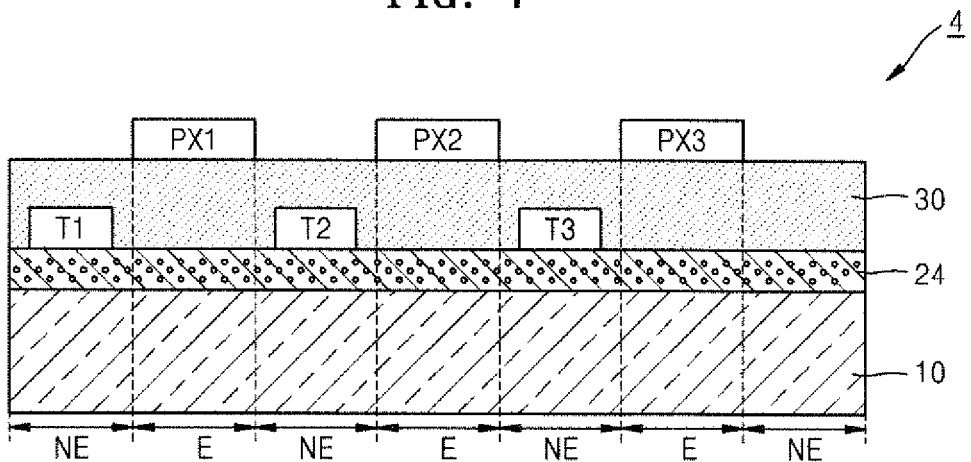

The organic light-emitting display device 4 according to another embodiment of the present invention will now be described with reference to FIG. 7.

In the organic light-emitting display device 3 according to the previous embodiment, the light absorbing layer 60 is formed as a separate element from the scattering structure 23, whereas in the organic light-emitting display device 4 of FIG. 6 according to the current embodiment, a scattering structure 24 includes a light absorbing layer. In other words, the light absorbing layer is formed on the same layer as the scattering structure 24, and may include scattering particles included in the scattering structure 24.

As such, since the light absorbing layer is included in the scattering structure 24 in the organic light-emitting display device 4 according to the current embodiment, a number of parts forming the organic light-emitting display device 4 may be decreased, and manufacturing processes of the organic light-emitting display device 4 may be simplified.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

The organic light-emitting display device 5 according to another embodiment of the present invention will now be described with reference to FIG. 8.

Figure 8:
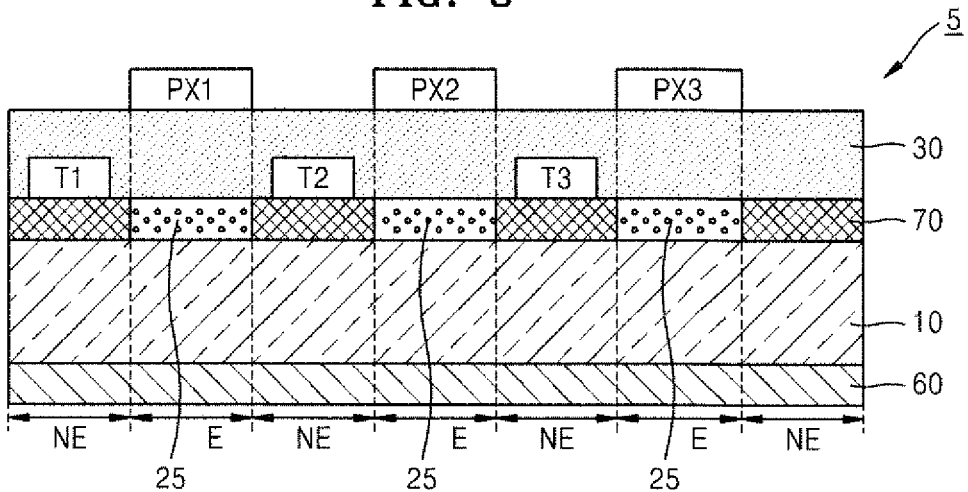

Referring to FIG. 8, the organic light-emitting display device 5 according to the current embodiment includes the light absorbing layer 60, the first substrate 10, a scattering structure 25, the TFT layer 30 including the TFTs T1, T2, and T3, the pixels PX1, PX2, and PX3, and a black matrix 70.

Comparing the organic light-emitting display device 5 with the organic light-emitting display device 3, the organic light-emitting display device 5 further includes the black matrix 70. The black matrix 70 is disposed in the non light-emitting region NE, and the scattering structure 25 is disposed in the light-emitting region E. By disposing the black matrix 70 in the non light-emitting region NE, where metal wire or the like is disposed, external light reflection may be more effectively absorbed.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

The organic light-emitting display device 6 according to another embodiment of the present invention will now be described with reference to FIG. 9.

Figure 9:
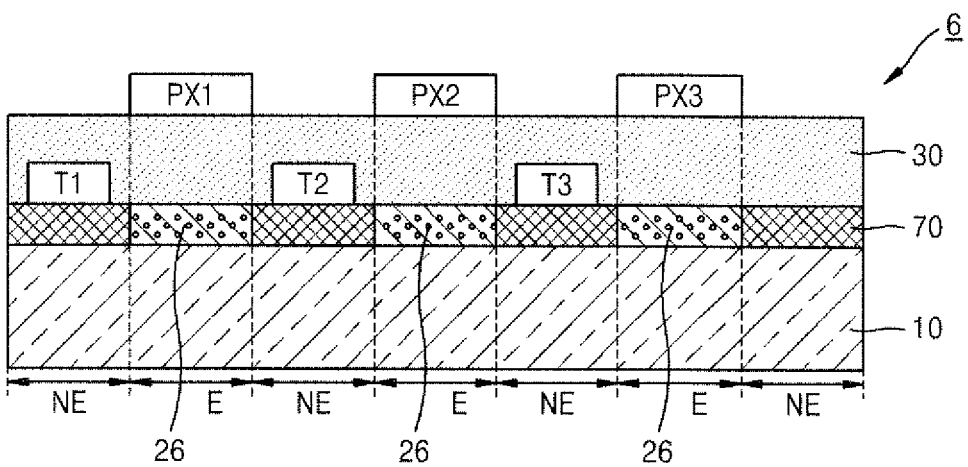

In the organic light-emitting display device 5 according to the previous embodiment, the light absorbing layer 60 is formed as a separate element from the scattering structure 25, whereas in the organic light-emitting display device 6 of FIG. 9 according to the current embodiment, a light absorbing layer is included in a scattering structure 26. In other words, the light absorbing layer is formed on the same layer as the scattering structure 26, and may include scattering particles included in the scattering structure 26.

As such, since the light absorbing layer is included in the scattering structure 26 in the organic light-emitting display device 6 according to the current embodiment, a number of parts forming the organic light-emitting display device 6 may be decreased, and manufacturing processes of the organic light-emitting display device 6 may be simplified.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

The organic light-emitting display device 7 according to another embodiment of the present invention will now be described with reference to FIG. 10.

Figure 10:
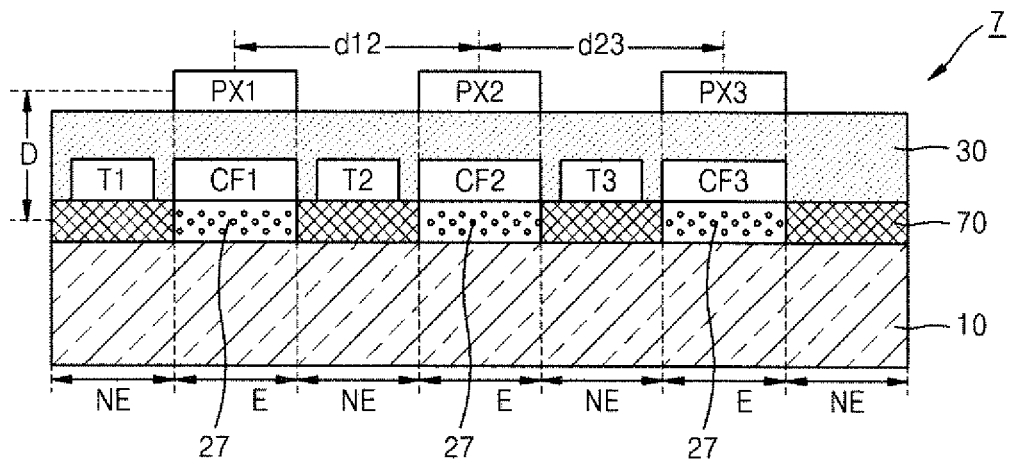

Referring to FIG. 10, the organic light-emitting display device 7 according to the current embodiment includes the first substrate 10, a scattering structure 27, the block matrix 70, the TFT layer 30 including the TFTs T1, T2, and T3, a plurality of color filters CF1, CF2, and CF3, and the pixels PX1, PX2, and PX3.

Optical resonance distances of the pixels PX1, PX2, and PX3 according to the current embodiment are differently designed. For example, a light in a red wavelength region is strongly emitted from the pixel PX1 according to optical resonance, a light in a blue wavelength region is strongly emitted from the pixel PX2 according to optical resonance, and a light in a green wavelength region is strongly emitted from the pixel PX3 according to optical resonance Any well known method of differently designing the optical resonance distances may be used, such as a method of differently designing a thickness of the first electrode 41 according to pixels, or a method of differently designing a thickness of the organic light-emitting layer 42 according to pixels.

As such, the color filters CF1, CF2, and CF3 are respectively disposed in locations corresponding to the pixels PX1, PX2, and PX3, in a direction of extracting the lights of the pixels PX1, PX2, and PX2 having different optical resonance distances.

Here, the color filters CF1, CF2, and CF3 include a certain color for penetrating a certain color emitted from the organic light-emitting layer 42, according to the designed optical resonance distances of the pixels PX1, PX2, and PX3. For example, the color filter CF1 including red is disposed in the pixel PX1 that strongly emits the light in the red wavelength region according to the optical resonance.

The color filter CF1 penetrates a red light emitted from the organic light-emitting layer 42. Meanwhile, when an external light is incident on the organic light-emitting display device 7, the color filter CF1 absorbs part of the external light by absorbing a blue light and a green light included in the external light. Also, a red light from among the external light, which penetrated through the color filter CF1, is absorbed by the pixel PX1 having a resonance structure for resonating a red light, thereby effectively reducing external light reflection in general.

Similarly, the color filter CF2 including blue is disposed in the pixel PX2 that strongly emits the light in the blue wavelength region according to the optical resonance, and the color filter CF3 including green is disposed in the pixel PX3 that strongly emits the light in the green wavelength region according to the optical resonance.

Also, according to the organic light-emitting display device 7 of the current embodiment, the scattering structure 27 is disposed in the light-emitting region E and the black matrix 70 is disposed in the non light-emitting region NE, thereby effectively reducing external light reflection.

Also, in the organic light-emitting display device 7 of the current embodiment, the scattering structure 27 is disposed at a location a distance D, equal to or below the pixel pitches d12 and d23 between adjacent pixels, away from the organic light-emitting layer 42 of the pixels PX1, PX2, and PX3 from which the light is emitted. Accordingly, pixel blurring, wherein the image is blurred, may be prevented.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

The organic light-emitting display device 8 according to another embodiment of the present invention will now be described with reference to FIG. 11.

Figure 11:
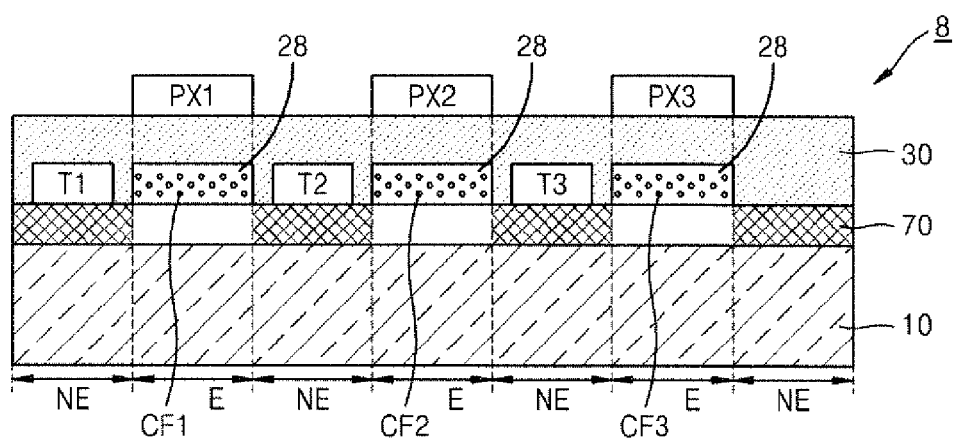

In the organic light-emitting display device 7 according to the previous embodiment, the color filters CF1, CF2, and CF3 are formed as separate elements from the scattering structure 27, whereas in the organic light-emitting display device 8 of FIG. 11 according to the current embodiment, a color filter is included in a scattering structure 28. In other words, the color filter is formed on the same layer as the scattering structure 28, and may include scattering particles included in the scattering structure 28.

As such, since the color filter is included in the scattering structure 28 in the organic light-emitting display device 8 according to the current embodiment, a number of parts forming the organic light-emitting display device 8 may be decreased, and manufacturing processes of the organic light-emitting display device 8 may be simplified.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

The organic light-emitting display device 9 according to another embodiment of the present invention will now be described with reference to FIG. 12.

Figure 12:
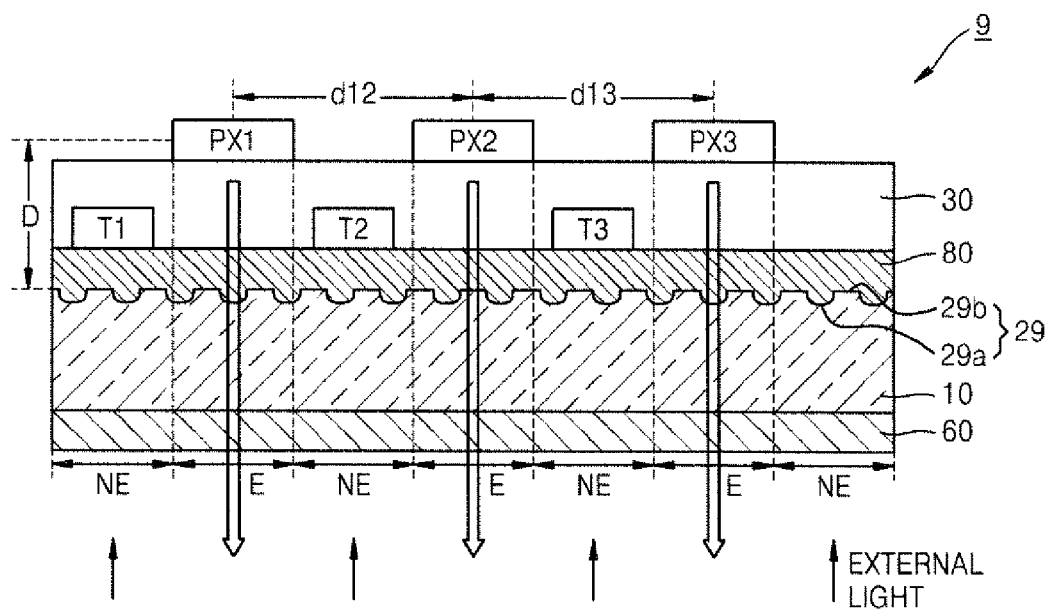

Referring to FIG. 12, the organic light-emitting display device 9 according to the current embodiment includes the light absorbing layer 60, the first substrate 10, a scattering structure 29 including concave-convex structures 29a and 29b, a high refractive planarization layer 80, the TFT layer 30 including the TFTs T1, T2, and T3, and the pixels PX1, PX2, and PX3.

The scattering structure 29 according to the current embodiment includes the concave-convex structures 29a and 29b. The concave-convex structures 29a and 29b are formed between the first substrate 10 and the high refractive planarization layer 80. The high refractive planarization layer 80 may be formed of a high refractive material, such as niobium pentoxide ($Nb_2O_5$). The scattering structure 29 including the concave-convex structures 29a and 29b, according to the current embodiment suppresses external light reflection like the scattering structures 21 through 28 including the scattering particles described above.

Also, in the organic light-emitting display device 9, the light absorbing layer 60 is disposed on one side of the first substrate 10, and thus the external light reflection is further suppressed.

Also, in the organic light-emitting display device 9 of the current embodiment, the scattering structure 29 is disposed at a location a distance D, equal to or below the pixel pitches d12 and d23 between adjacent pixels, away from the organic light-emitting layer 42 of the pixels PX1, PX2, and PX3 from which the light is emitted. Accordingly, pixel blurring, wherein the image is blurred, may be prevented.

Additionally, another substrate (not shown), facing the first substrate, may operate as an encapsulation member for encapsulating the pixels PX1, PX2, and PX3 so as to protect the pixels PX1, PX2, and PX3 from external moisture and oxygen.

According to organic light-emitting display devices of the embodiments of the present invention, external light reflection is suppressed and pixel blurring is reduced to improve visibility of the organic light-emitting display devices, by disposing a scattering structure in a location away from a distance equal to or below a pixel pitch between adjacent pixels.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device comprising:
a first substrate;
a second substrate facing the first substrate;
a plurality of pixels disposed between the first and second substrates, and comprising a first electrode, a second electrode, and an organic light-emitting layer disposed between the first and second electrodes;
a scattering structure disposed in a direction a light emitted from the organic light-emitting layer is extracted from the plurality of pixels, being not in direct contact with the pixels and at a distance from the organic light-emitting layer of the plurality of pixels equal to or below a pixel pitch between adjacent pixels, and a light absorbing layer disposed in the direction the light is extracted, wherein the scattering structure is a resin layer comprising a plurality of scattering particles, and the light absorbing layer is disposed on the same layer as the scattering structure, and comprises a plurality of the same type of scattering particles as the scattering structure.

2. The organic light-emitting display device of claim 1, wherein the scattering structure is disposed in a light-emitting region corresponding to the plurality of pixels.

3. The organic light-emitting display device of claim 1, further comprising a black matrix disposed in a non light-emitting region excluding the light-emitting region corresponding to the plurality of pixels.

4. The organic light-emitting display device of claim 3, wherein the black matrix is disposed in the non light-emitting region and the light-emitting region alternately with the scattering structure.

5. The organic light-emitting display device of claim 1, wherein an optical resonance distance between the plurality of pixels is differently designed, and the organic light-emitting display device further comprises a color filter disposed in a light-emitting region corresponding to the plurality of pixels.

6. The organic light-emitting display device of claim 5, wherein the plurality of pixels penetrate a certain color emitted from the organic light-emitting layer according to the designed optical resonance distance, and comprise a color filter comprising the certain color.

7. The organic light-emitting display device of claim 6, wherein the color filter is disposed closer than the distance the scattering structure is disposed from the organic light-emitting layer.

8. The organic light-emitting display device of claim 6, wherein the color filter is disposed on the same layer as the scattering structure, and comprises a plurality of the same type of scattering particles as the scattering structure.

9. The organic light-emitting display device of claim 6, further comprising a black matrix disposed in a non light-emitting region excluding a light-emitting region corresponding to the plurality of pixels.

10. The organic light-emitting display device of claim 9, wherein the black matrix is disposed in the non light-emitting region and the light-emitting region alternately with the scattering structure.

* * * * *